United States Patent [19]

Esashi

[11] Patent Number: 5,045,400

[45] Date of Patent: Sep. 3, 1991

[54] COMPOSITION FOR AND METHOD OF METALLIZING CERAMIC SURFACE, AND SURFACE-METALLIZED CERAMIC ARTICLE

[75] Inventor: Kiyoyuki Esashi, Higashiosaka, Japan

[73] Assignee: Nippon Hybrid Technologies Co., Ltd., Osaka, Japan

[21] Appl. No.: 473,326

[22] Filed: Feb. 1, 1990

[30] Foreign Application Priority Data

Jun. 2, 1989 [JP] Japan .................................. 1-27296

[51] Int. Cl.$^5$ ...................... B32B 15/04; C22C 27/04; C22C 22/00
[52] U.S. Cl. .................................. 428/450; 419/8; 420/432; 420/580; 428/433; 428/434; 428/701; 428/704; 428/697; 428/698; 428/615; 428/627; 428/469; 428/472
[58] Field of Search ................ 420/580, 432; 428/615, 428/627, 433, 697, 472, 469, 434, 698, 701, 704, 450

[56] References Cited

U.S. PATENT DOCUMENTS

| | | | |
|---|---|---|---|
| 2,600,995 | 6/1952 | Kurtz | 420/432 |
| 3,661,595 | 5/1972 | Buck | 420/580 |
| 4,003,715 | 1/1977 | Cascone | 428/627 |
| 4,382,909 | 5/1983 | Zwingmann | 420/580 |
| 4,485,150 | 11/1984 | Tsuno | 428/632 |
| 4,532,190 | 7/1985 | Kanbe | 428/627 |
| 4,717,538 | 1/1988 | Patrician | 420/580 |
| 4,894,273 | 1/1990 | Lieberman | 428/433 |
| 4,961,781 | 10/1990 | Morishita | 428/627 |
| 4,980,239 | 12/1990 | Harada | 428/627 |

FOREIGN PATENT DOCUMENTS

| | | | |
|---|---|---|---|
| 988747 | 5/1976 | Canada | 420/432 |
| 61-014181 | 1/1986 | Japan | 428/450 |
| 63-60186 | 3/1988 | Japan | 428/450 |

*Primary Examiner*—Ellis P. Robinson
*Assistant Examiner*—Amara E. Lim
*Attorney, Agent, or Firm*—Ratner & Prestia

[57] ABSTRACT

Disclosed is a composition for metallizing a ceramic surface which consists essentially of 10.0 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0 to 20.0% by weight of the total amount of Ni and Ag. This composition is applied to the surface of a ceramic body in the form of a metal paste or metal powder and heat-fusion-bonded to the ceramic surface, or the composition is applied to the surface of a ceramic body by the gas-phase deposition method.

7 Claims, 2 Drawing Sheets

COMPOSITION FOR AND METHOD OF METALLIZING CERAMIC SURFACE, AND SURFACE-METALLIZED CERAMIC ARTICLE

BACKGROUND OF THE INVENTION

1. Field of the Invention

The present invention relates to a novel composition for metallizing surfaces of ceramics such as aluminum nitride, alumina and silicon nitride, a method of metallizing ceramic surfaces by using this composition, and a surface-metallized ceramic article formed by utilizing these composition and method.

2. Description of the Related Art

Only where at least several % of an $SiO_2$ component is contained has a method of metallizing a ceramic surface by baking a mixture of Mo, Mn and a frit component at a temperature of 1300° to 1600° C. in wet hydrogen, i.e., the Mo-Mn method, been adopted, but although a metallizing composition applicable to a high-purity ceramic sintered body in which the content of the glass phase in the crystal grain boundary is low, i.e., alumina, aluminum nitride or silicon nitride having a purity of at least 99%, has been developed, there is still room for a further improvement thereof.

For example, a composition of the Cu-Ag-Ti system is a usual metallizing composition applicable to alumina and aluminum nitride, and if the Ti content is reduced to less than 5% in this composition, the metallized pattern is disturbed or pinholes are readily formed, and if the Ti content is increased, the metallized layer becomes hard and is easily broken because of the different thermal coefficients of expansion of the ceramics. A composition of the Pd-Ta-Zr-Mn-Ni-Cu system as disclosed in Japanese Unexamined Patent Publication No. 63-60186 can be mentioned as the metallizing composition applicable to aluminum nitride, but since scores of % of Pd, which is a noble metal, and an expensive Ta are contained in the composition, the metallizing composition of this type is very costly.

A composition of the Nb-Cr-Zr-C-Si-SiC-Ni system as disclosed in Japanese Unexamined Patent Publication No. 61-014181 can be mentioned as the metallizing composition for silicon nitride, and this composition is practically used in various fields, but since the metallization is effected at a high temperature exceeding 1200° C., in the case of a sintered body having a high content of a sintering aid such as $Y_2O_3$, the grain boundary containing $Y_2O_3$ is quickly deteriorated, and thus many problems remain to be solved.

SUMMARY OF THE INVENTION

The present invention was completed as the result of the research into the kinds and contents of constituent elements of a metallizing composition having an appropriate reactivity with ceramics such as high-purity alumina, aluminum nitride and silicon nitride, and a wetting property, and into the heat treatment for the metallization, and an object of the present invention is to provide a technique of metallizing a ceramic surface with an enhanced strength and an increased reliability.

Therefore, in accordance with the present invention, there is provided a composition for metallizing the surface of a ceramic sintered body, which consists essentially of 10.0 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0% to 20.0% by weight of the total amount of Ag and Ni.

Furthermore, in accordance with the present invention, there is provided a method of metallizing a ceramic surface, which comprises applying a composition consisting essentially of 10.0 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0 to 20.0% by weight of the total amount of Ag and Ni, in the form of a metal powder or paste to the surface of a ceramic body, and heating the ceramic body in a non-oxidizing atmosphere to melt or semi-melt the composition and metallize the surface of the ceramic body.

Still further, in accordance with the present invention, there is provided a method of metallizing a ceramic surface, which comprises depositing in the gas phase a layer of a composition consisting essentially of 10.0 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0 to 20.0% by weight of the total amount of Ag and Ni, on the surface of a ceramic body to metallize the surface of the ceramic body.

As the gas phase deposition method, PVD processes such as sputtering, ion plating or vacuum deposition, and a CVD process, can be used.

A surface-metallized ceramic article of the present invention is formed by applying the above-mentioned composition to the surface of a ceramic body according to the above-mentioned method.

DESCRIPTION OF THE PREFERRED EMBODIMENTS

Figure 1:
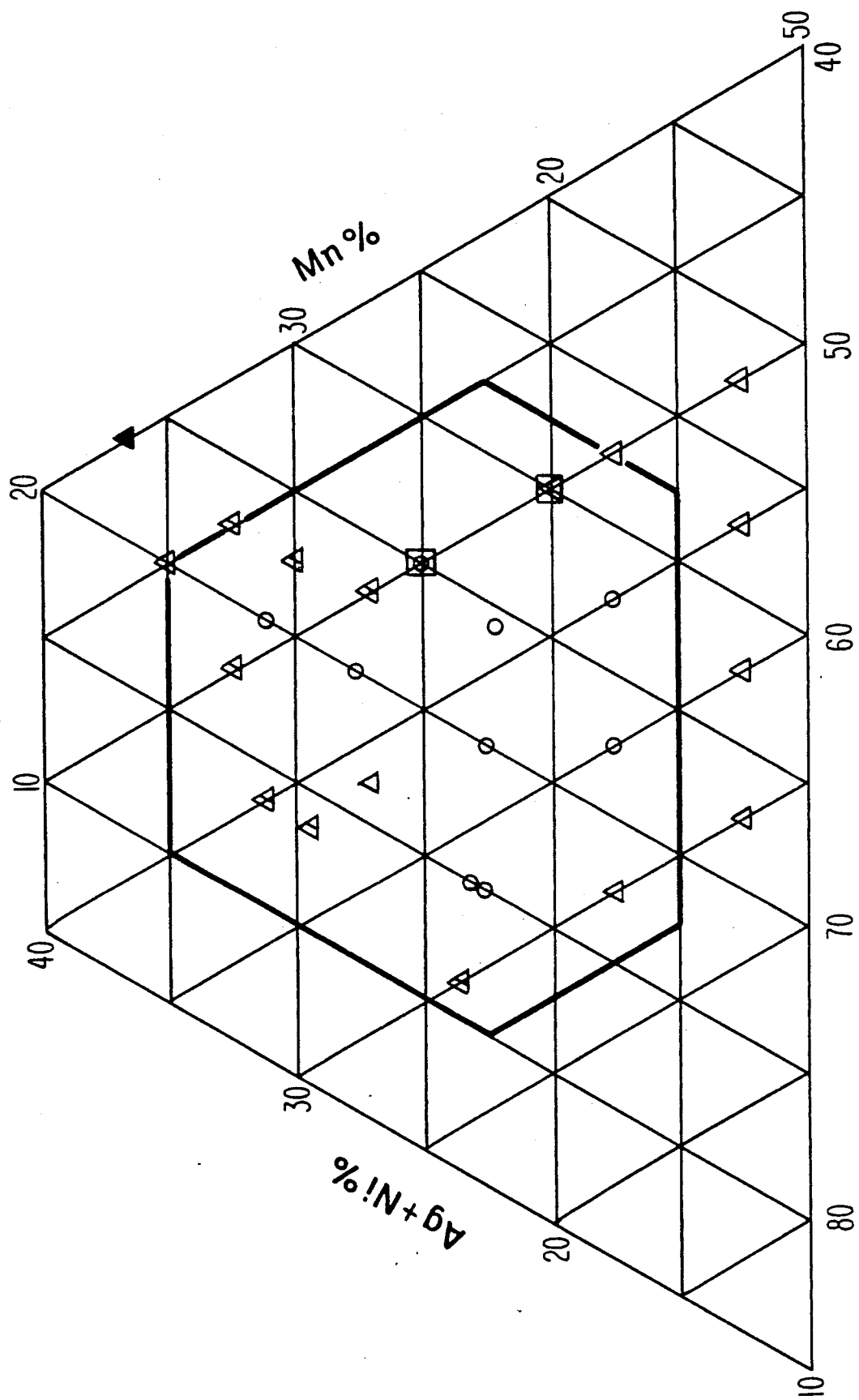
FIG. 1, shows the component range of the metallizing composition disclosed in Example 1, in which a polygonal region surrounded by the thick line is the component region of the present invention and marks o, △, □, X and ▲ indicate the characteristics, described in Example 1, of each composition.

The ceramics used in the present invention include AlN (aluminum nitride), AlN-BN, AlN-$Si_3N_4$, $Si_3N_4$ (silicon nitride), $Si_3N_4$-BN, $Si_3N_4$-SiC, Sialon, $Al_2O_3$ (alumina) and $Al_2O_3$-$ZrO_2$, and ceramic sintered bodies containing various sintering aids, in which AlN, $Si_3N_4$ or $Al_2O_3$ occupies at least 60% by volume. The metallizing composition of the present invention is advantageous in that an AlN ceramic body containing up to 5% by weight of a sintering aid such as $YC_2$, YN, $YH_{2-3}$, $YF_3$, $Y_2O_3$, CaO, $CaC_2$, $CaF_2$, $Ca_3N_2$ or $CaH_2$ and a high-purity $Al_2O_3$ ceramic body containing up to 1% by weight of a sintering aid such as $SiO_2$ can be effectively metallized.

Since among these ceramics Mn has a weak reactivity, Mn improves the peel strength of the metallized layer, and when the composition is molten or semi-molten, Mn shows a good wetting property and a desired pattern can be precisely formed on the ceramic surface. If Mn is contained in too large an amount, however, the melting point disadvantageously rises or the metallized layer is hardened or is rendered easily oxidizable, and various problems such as a coloration or blackening of the ceramic surface base other than the pattern portion arise. Accordingly, the Mn must be incorporated in an amount of 10.0 to 32.5% by weight, preferably 12 to 26% by weight.

Zr and Ti are active elements having a higher activity than Mn and effectively improve the peel strength. Nevertheless, because the activity is too high, if the element is incorporated in too large an amount, the metallized layer is rendered easily oxidizable, the formation of a smooth surface is difficult, and the flowability of the solder is reduced at the soldering step. Accordingly, the total amount of Zr and Zi is limited to up to 5.0% by weight, and these elements need not be incorporated at all. If incorporated the amount is preferably up to 2.5% by weight.

Ag is a noble metal and has no substantial adhesive force to non-oxide type ceramics, but Ag forms an alloy with Mn, Ti or Zr to control the oxidation of the oxidizable element such as Mn, Ti or Zn, and is effective for softening the metallized layer and moderating the residual stress generated by the difference of the thermal coefficient of expansion of the metallized layer and the ceramic base. If Ag is incorporated in too large an amount, however, the wetting property or adhering property of the metallizing composition to ceramics is reduced, and small holes in the metallized layer or defects in the interface are easily formed. Accordingly, Ag is incorporated in an amount of 15.0 to 35% by weight as the total amount of Ag and Ni.

Ni is substantially not oxidizable and has little or no adhesive force to ceramics. Nevertheless, when Mn or the like reacts with ceramics to form a nitride or oxide and Al or Si in aluminum nitride, alumina or silicon nitride is diffused into the metallized layer, if Ni is present in the metallized layer, Al or Si is caught in the Ni phase and a solid solution or intermetallic compound is easily formed, and since this solid solution or intermetallic compound is relatively inactive to oxygen, a metallized layer having a smooth surface and a reduced oxidation coloration is easily formed. Where Ni is not present but only Ag is incorporated, Al and Si cause a eutectic reaction at a low melting point, and therefore, a phase enriched with Al and Si is readily precipitated in the metallized layer and is easily oxidizable, and thus it is difficult to form a metallized layer having a smooth surface and an excellent strength. If Ni is incorporated in an amount more than Ag, however, the melting temperature of the metallizing composition becomes too high, and an excessive reaction with ceramics and a hardening of the metallized layer occur. Therefore, Ni can be incorporated in a limited amount of 5.0 to 20.0% by weight of the total amount of Ag and Ni. Since Ni is an element having no substantial direct reactivity with ceramics as well as the above-mentioned Ag, although Ag is not alloyed with Ni, the total amount of Ag and Ni, collected together, can be defined as 15.0 to 35.0% by weight, as pointed out hereinbefore. Preferably, the total amount of Ag and Ni is 18 to 32% by weight.

W is a high-melting-point metal having a melting point of 3653° K., and M is substantially not fused by Ag, Ni and Mn, which are melted at a temperature of about 960° to about 1100° C. Accordingly, W rarely forms an alloy but can be present in the form of single powder particles or a single layer in the metallized layer. Accordingly, the inherent properties of W are directly reflected on the metallized layer, and since W has a high melting point, W exerts a function of substantially preventing corrosion by a metal solder at the subsequent soldering step. Moreover, since M has a low thermal coefficient of expansion, M reduces the thermal coefficient of expansion of the metallized layer.

If W is incorporated in an excessive amount, however, the adhesive force of the metallized layer to ceramics is reduced. Therefore, W is incorporated in an amount of 45 to 67.5% by weight, preferably 48 to 65% by weight.

According to the first method of metallizing a ceramic surface with the metallizing composition of the present invention, an alloy having the above-mentioned composition or a mixed powder of W and other elements, having a size smaller than 150 mesh, preferably a size of 325 mesh to an order of submicrons, is thoroughly mixed, and to impart an appropriate flowability and an appropriate adhesive force to a ceramic surface, a vehicle of the ethyl cellulose or acrylic type is added as the binder to the formed composition to form a paste. The paste is coated on a predetermined ceramic surface by screen printing, brush coating or spatula coating, and the coated ceramic body is dried and then maintained in a non-oxidizing atmosphere such as Ar, $N_2$, $H_2$ or vacuum at a temperature of 960° to 1100° C., preferably 1000° to 1100° C., for 5 to 30 minutes, whereby the composition becomes molten or semi-molten and a metallized layer is formed. As another method of applying and contacting powder particles to and with the ceramic surface, a method can be adopted in which a binder as mentioned above is first coated on the ceramic surface and the powder is sprinkled thereafter to cover the surface.

Figure 2:
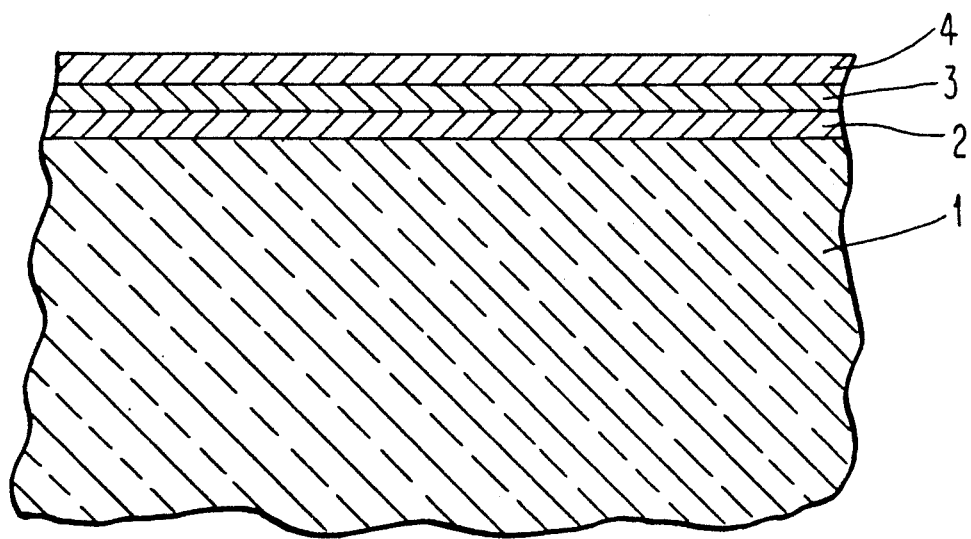
FIG. 2 is a sectional diagram of a surface-metallized ceramic body.

According to the second method of the present invention, an alloy of the metallizing composition of the present invention or a film having a layer structure having an average composition corresponding to the composition of the present invention is directly precipitated onto the ceramic surface from the gaseous phase. As the means for effecting this deposition, a method can be adopted in which a sputtering treatment is carried out by using a target composed of an alloy of the composition of the present invention or composed partially or completely of a pure metal, or a method in which a vacuum deposition treatment, an ion plating treatment or a CVD treatment is carried out. By such means, a film of the composition of the present invention can be formed on a ceramic body to cover the ceramic surface with a metallized layer. Where a plurality of coating layers are formed, if an active element such as Mn, Ti or Zr is incorporated in the lowermost layer, the adhesive force is improved, and by an elevation of the temperature, the diffusion is advanced and a stronger bonding is attained. This state is diagrammatically illustrated in FIG. 2, wherein reference numeral 1 represents a ceramic body and reference numerals 2, 3 and 4 represent multi-metallized layers, the average composition of which is in accord with the composition of the present invention. Note, the layers 2, 3 and 4 may be a single composition layer. Even if the temperature is elevated to a level of 960° to 1100° C. at which this gas-phase coated layer becomes molten or semi-molten, the fused film does not form liquid drops but reacts more strongly with the ceramic body, and a high stability is obtained at subsequent steps.

A ceramic article prepared by the surface covering treatment with the metallizing composition of the present invention according to the above-mentioned method of the present invention can cope with a soldering treatment or a brazing treatment for attaching a metal part or semiconductor to the ceramic surface, because a strong bonding is attained between the surface metal compound layer and the ceramic surface, and a soldered or brazed part having a high strength and a high air-tightness can be prepared. Since it is possible not to incorporate Ti or Zr in the metallizing composition or it is possible to reduce the content of Ti or Zr to a very low level, by carrying out Ni plating, Cu plating, Ag plating or Au plating, a product having a good solder flowability can be obtained. Furthermore, if a sintering treatment is carried out at a temperature of about 600° to about 850° C., after the plating operation, the adhesion of the plating layer can be improved.

The ceramic article treated according to the present invention can be used, for example, for the production of air-tight parts of high-purity aluminum, high heat conductivity radiator copper-clad substrates of aluminum nitride, packages of various electronic parts, tool tips of silicon nitride, abrasion-resistant tiles and liners, automobile engine parts and the like.

EXAMPLES

The present invention will now be described in detail with reference to the following examples. Note, all of "%" in the examples are by weight.

EXAMPLE 1

Metallizing composition of the present invention and metallizing compositions outside the scope of the invention, as shown in Table 1, were prepared by mixing fine metal powders having a size smaller than 325 mesh.

Each composition was mixed with a vehicle of the ethyl cellulose type to form a paste, the paste was printed and dried in the form of a pattern having a diameter of 8.0 mm on the surface of an AlN ceramic body obtained by sintering under atmospheric pressure, which had a square shape of 12.0 mm × 12.0 mm and a thickness of 0.64 mm, and the paste layer was fusion-bonded at 1050° C. for 20 minutes in $H_2$ current to the ceramic surface to form a metallized layer on the ceramic surface. Then, the appearance and fusion-bonding state were observed by a microscope, and after confirmation of the presence of small holes, a rubbing test was carried out by using a sharp knife to determine whether or not peeling readily occurred, whereby the bonding strength was qualitatively determined.

The results are shown in Table 1. In FIG. 1, a mark ▲ indicates no fusion bonding, a mark Δ indicates peeling at the rubbing test, a mark X indicates a poor wetting property of the composition where micropores were present, and a mark ● indicates the presence of a black residue of undissolved Mn on the surface. When two marks are simultaneously shown, this means that both of the relevant defects appeared. Only a composition indicated by mark o has no problems and no peeling.

As apparent from FIG. 1, the metallizing composition of the present invention provides especially excellent characteristics when specific components are contained in amounts within certain ranges, and even the composition in the peripheral range exerts practically satisfactory effects if the treatment temperature, time, atmosphere, and other conditions are appropriately set.

TABLE 1

| Run No. | Contents (%) of Components of Metallizing Composition | | | | Appearance of Fusion Bonding State | Classification |
|---|---|---|---|---|---|---|
| | Mn | W | Ag + Ni | Ni/(Ag + Ni) | | |
| 1 | 23.0 | 40.0 | 37.0 | 13.5 | no fusion bonding | outside present invention |
| 2 | 20.0 | 45.0 | 35.0 | 20.0 | fusion bonding, micropores | within scope of present invention |
| 3 | 22.5 | 45.0 | 32.5 | 15.5 | fusion bonding, micropores | |
| 4 | 17.5 | 50.0 | 32.5 | 18.5 | fusion bonding, micropores | |
| 5 | 20.0 | 49.0 | 31.0 | 13.0 | fusion bonding | |
| 6 | 14.0 | 55.0 | 31.0 | 13.0 | fusion bonding, micropores | |
| 7 | 22.5 | 47.5 | 30.0 | 15.0 | fusion bonding, micropores | |
| 8 | 14.0 | 57.0 | 29.0 | 7.0 | fusion bonding, micropores | |
| 9 | 20.0 | 52.5 | 27.5 | 15.0 | fusion bonding | |
| 10 | 16.0 | 57.0 | 27.0 | 11.0 | fusion bonding | |
| 11 | 25.0 | 50.0 | 25.0 | 16.0 | fusion bonding, residue | |
| 12 | 15.0 | 62.0 | 23.0 | 8.7 | fusion bonding | |
| 13 | 23.0 | 50.0 | 27.0 | 11.0 | fusion bonding | |
| 14 | 24.0 | 53.5 | 22.5 | 15.0 | fusion bonding | |
| 15 | 20.0 | 57.5 | 22.5 | 15.0 | fusion bonding | |
| 16 | 15.0 | 62.5 | 22.5 | 15.0 | fusion bonding | |
| 17 | 11.0 | 65.0 | 24.0 | 12.5 | fusion bonding, micropores | |
| 18 | 30.0 | 50.0 | 20.0 | 20.0 | fusion bonding, residue | |
| 19 | 32.5 | 50.0 | 17.5 | 15.5 | fusion bonding | |
| 20 | 27.5 | 55.0 | 17.5 | 15.0 | fusion bonding | |
| 21 | 22.5 | 60.0 | 17.5 | 15.0 | fusion bonding | |
| 22 | 17.5 | 65.0 | 17.5 | 15.0 | fusion bonding | |
| 23 | 37.5 | 50.0 | 12.5 | 15.0 | fusion bonding, brittleness | outside of present invention |
| 24 | 32.5 | 55.0 | 12.5 | 15.0 | fusion bonding, brittleness | |
| 25 | 27.5 | 60.0 | 12.5 | 15.0 | fusion bonding, brittleness | |

TABLE 1-continued

| Run No. | Contents (%) of Components of Metallizing Composition | | | | Appearance of Fusion Bonding State | Classification |
|---|---|---|---|---|---|---|
| | Mn | W | Ag + Ni | Ni/(Ag + Ni) | | |
| 26 | 22.5 | 65.0 | 12.5 | 15.0 | fusion bonding, brittleness | |

EXAMPLE 2

Composition No. 6 and composition No. 9 shown in Table 2, a composition of the present invention where Mn was 13.5%, W was 52.8%, (Ag+Ni) was 29.7%, Ni was 12.8% of (Ag+Ni) and Ti was 4.0%, and a composition of the present invention where 4.0% of Zr was added instead of Ti in the above composition, were coated in a square pattern of 2 mm × 2 mm on the surfaces of AlN and then sintered in the same manner as described in Example 1, whereby metallized layers were prepared. Good results were obtained except that undulations were obvious when Ti and Zr were incorporated. Then, Ni was plated on each of the metallized layers, and after sintering at 700° C. in $H_2$, a copper wire having a diameter of 0.8 mm was vertically held on the Ni plating layer and then soldered. The sample was then subjected to a tensile test, and it was found that the strength was as high as 4.3 to 5.3 kg/mm$^2$, and that the sample could be practically used.

EXAMPLE 3

Each of composition No. 6, composition No. 9, composition No. 15 and composition No. 16 shown in Table 1 was fusion-bonded to a square alumina piece of 10 mm × 10 mm having a thickness of 3 mm, which was composed of alumina having a purity of 99.0%, in the same manner as described in Example 1, and composition No. 16 shown in Table 1 was similarly fusion-bonded to a piece of $Si_3N_4$ having the same shape as described above, whereby metallized layers were formed. The observation and rubbing test were then carried out, and in the case of $Al_2O_3$, no defect was observed in the metallized layer, and peeling was most difficult in run No. 9 and run No. 16. No defect was observed in the case of $Si_3N_4$, and it was found that a strong bonding was attained in run No. 16.

EXAMPLE 4

Compositions shown in Table 2 were fusion-bonded to AlN and $Al_2O_3$ described above and composition No. 16 was fusion-bonded to $Si_3N_4$ in the same manner as described in the preceding examples. After the Ni plating, Koval having a diameter of 8.0 mm and a length of 10 mm was soldered at a temperature higher than 800° C. in $H_2$ by using a silver solder, and the obtained samples were subjected to the shearing test. The results are shown in Table 2. A value of 3.5 kg/mm$^2$ was obtained in the case of $Si_3N_4$. Each sample had a strength applicable to practical use, and accordingly, it was shown that the present invention is effective for practical use.

TABLE 2

| Run No. | Contents (%) of Components of Metallizing Composition | | | | | Shear Strength (kg/mm$^2$) | | Classification |
|---|---|---|---|---|---|---|---|---|
| | Mn | W | Ag + Ni | Ni/(Ag + Ni) | Other | AlN | Al$_2$O$_3$ | |
| 9 | 20.0 | 52.5 | 27.5 | 15.0 | — | 4.0 | 5.6 | within scope of present invention |
| 16 | 15.0 | 52.5 | 22.5 | 15.0 | — | 3.2 | 5.3 | |
| 27 | 13.0 | 52.8 | 29.7 | 12.8 | Ti, 4.0 | 6.3 | 6.0 | |
| 28 | 20.0 | 49.5 | 27.5 | 14.9 | Ti, 3.0 | 4.9 | 5.5 | |
| 29 | 20.0 | 49.5 | 27.5 | 14.9 | Zr, 3.0 | 2.8 | 6.0 | |
| 30 | 20.0 | 51.0 | 27.5 | 14.9 | Ti, 1.5 | 3.5 | 4.9 | |
| 31 | 22.5 | 47.5 | 28.5 | 15.1 | Ti, 1.5 | 2.8 | 7.0 | |
| 25 | 27.5 | 60.0 | 12.5 | 15.0 | — | 0.5 | 1.4 | outside present invention |

EXAMPLE 5

Composition No. 9 and composition No. 16 were coated and sintered on both the surface of AlN plates having a side of 25.4 mm and a thickness of 0.64 mm, except a margin of 1 mm from the edge on the front surface, in the same manner as described in Example 1. Note, the entire surface was coated on the back surface side. The surfaces were finished by polishing and pickling, and copper sheets having a thickness of 0.3 mm and the same size as the coating pattern were piled contiguously to the front and back surfaces. The assembly was held at 800° C. in $H_2$ for 5 minutes under a load to effect direct bonding. The obtained samples showed a high bonding strength such as a tensile strength of 4 kg/mm$^2$, and it was confirmed that copper sheets can be directly bonded without an intervening silver solder. In view of the foregoing, the present invention is suitable for the production of thyristors and heat sinks for laser diodes, and if a complicated circuit pattern is formed on a copper sheet by first pressing or etching, a large-power circuit that can be directly attached to a large-size silicon chip can be advantageously manufactured.

I claim:

1. A composition for metallizing a ceramic surface, which consists essentially of 10.0 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0 to 20.0% by weight of the total amount of Ni and Ag.

2. A composition as set forth in claim 1, which consists essentially of 12 to 26% by weight of Mn, 48 to 65% by weight of W, up to 2.5% by weight of at least one member selected from Ti and Zr, and Ag and Ni in a total amount of 18 to 32% by weight, the amount of Ni being 5 to 20% by weight of the total amount of Ni and Ag.

3. A composition as set forth in claim 1, which is a metal powder composition.

4. A composition as set forth in claim 3, which further comprises a vehicle and is in the form of a paste.

5. A metallized ceramic article comprising a ceramic body having a surface metallized with a composition consisting essentially of 10 to 32.5% by weight of Mn, 45.0 to 67.5% by weight of W, up to 5.0% by weight of at least one member selected from Ti and Zr, and Ag and Ni in a total amount of 15.0 to 35.0% by weight, the amount of Ni being 5.0 to 20.0% by weight of the total amount of Ni and Ag.

6. An article as set forth in claim 5, wherein the ceramic body is composed of at least one member selected from the group consisting of aluminum nitride, alumina and silicon nitride.

7. An article as set forth in claim 5, wherein the ceramic body comprises at least 99% of a high-purity ceramic and up to 1% of a sintering aid.

* * * * *

UNITED STATES PATENT AND TRADEMARK OFFICE
CERTIFICATE OF CORRECTION

PATENT NO.    : 5,045,400
DATED         : September 3, 1991
INVENTOR(S)   : Kiyoyuki Esashi It is certified that error appears in the above—identified patent and that said Letters Patent is hereby corrected as shown below:

On cover page, in the heading, under Foreign Application Priority Data, change "June 2, 1989" to --February 6, 1989--.

Signed and Sealed this

Twenty-third Day of February, 1993

*Attest:*

STEPHEN G. KUNIN

*Attesting Officer*    Acting Commissioner of Patents and Trademarks